United States Patent
Kim

(10) Patent No.: US 7,163,832 B2
(45) Date of Patent: Jan. 16, 2007

(54) METHOD FOR MANUFACTURING CMOS IMAGE SENSOR

(75) Inventor: Hong-Ik Kim, Chungcheongbuk-do (KR)

(73) Assignee: Magnachip Semiconductor Ltd., Chungcheongbuk-do (KR)

( * ) Notice: Subject to any disclaimer, the term of this patent is extended or adjusted under 35 U.S.C. 154(b) by 166 days.

(21) Appl. No.: 10/983,990

(22) Filed: Nov. 8, 2004

(65) Prior Publication Data
US 2005/0101049 A1     May 12, 2005

(30) Foreign Application Priority Data
Nov. 12, 2003    (KR) .................. 10-2003-0079836

(51) Int. Cl.
*H01L 21/00*    (2006.01)

(52) U.S. Cl. ................ 438/22; 438/48; 438/69; 438/70

(58) Field of Classification Search ............... 438/22, 438/48
See application file for complete search history.

(56) References Cited

U.S. PATENT DOCUMENTS

| 5,595,930 | A  | * | 1/1997 | Baek ...................... 438/60 |
| 6,369,417 | B1 |   | 4/2002 | Lee |
| 6,429,036 | B1 |   | 8/2002 | Nixon et al. |
| 6,617,189 | B1 | * | 9/2003 | Chen et al. ............... 438/48 |
| 6,737,719 | B1 | * | 5/2004 | Yamamoto ............... 257/432 |

* cited by examiner

*Primary Examiner*—Dung A. Le
(74) *Attorney, Agent, or Firm*—Marshall, Gerstein & Borun LLP

(57) ABSTRACT

The present invention discloses a method for manufacturing an image sensor which makes the boundaries between microlenses clear by forming a guide layer in advance and can increase the focal distance of light and the quantity of light by forming the spheres of the microlenses to have a constant height.

8 Claims, 3 Drawing Sheets

METHOD FOR MANUFACTURING CMOS IMAGE SENSOR

BACKGROUND OF THE INVENTION

1. Field of the Invention

The present invention relates to a method for manufacturing an image sensor, and more particularly, to a method for manufacturing a CMOS image sensor which can maximize the color filter array effect of a CMOS image sensor and achieve simplification and stabilization of the process.

2. Description of the Related Art

Generally, a microlens is formed in order to maximize the effect of the color filter array (CFA) of a CMOS image sensor. Such a microlens is shaped by coating a photosensitive photoresist of silicon oxides based having high light transmittance by a spin-on coating machine, patterning the same by use of a mask, and curing the same by thermally flowing it.

FIG. 1 is a sectional view for showing a CMOS image sensor formed according to one of conventional techniques.

As shown in FIG. 1, a semiconductor device with a color filter and a microlens includes a semiconductor substrate 10 which has underwent shallow trench isolation (STI) and a passivation processes, a first overcoating layer (OCL) 12 formed on the semiconductor substrate 10, a color filter array (CFA) layer 14 formed on the overcoating layer 12, a second overcoating layer 16 and a microlens (ML) layer 18 formed on the second overcoating layer 16.

In case of forming a microlens with a size of less than 4 μm by the method as shown in FIG. 1, it is problematic in that the uniformity of size and height is lowered due to the inaccuracy of the boundary portions of the edges.

Moreover, it is difficult to measure a critical dimension (CD) due to the inaccuracy of a pattern, and the quantity of light approaching the photo-diode region is lowered due to the instability of the process.

Furthermore, it is difficult to adjust the thickness of a CFA and the CD size of the CFA due to the non-uniformity of the sub-topology upon forming of the CFA layer 14, thereby making the process unstable.

In a typical image sensor, the image of an object is stored in photo-electrons focused on the above-mentioned PD and then converted into an electric signal. Accordingly, the quantity of the image converted into an electric signal is decreased or becomes non-uniform, thus the image properties of the image sensor device are deteriorated and the sensor function is also deteriorated.

Further, although an etching process has been often employed in order to overcome the circumstance similar to the above-mentioned problem, this is such a process against the reduction of defects and this increases the number of process steps and becomes disadvantageous in terms of cost saving.

SUMMARY OF THE INVENTION

The present invention is designed in consideration of the problems of the prior art, and therefore it is a primary object of the present invention to provide a method for manufacturing an image sensor which makes the boundaries between the microlenses clear by forming a guide layer in advance and can increase the focal distance of light and the quantity of light by forming the spheres of the microlenses to maintain a constant height.

It is another object of the present invention to provide a method for manufacturing a CMOS image sensor which makes a color filter array free of the topology of passivation by preserving a planarization process (an overcoating layer) as it is simply by an overcoating layer resist patterning process without accompanying etching and removal processes and which makes it easier to control the size of the color filter array.

To achieve the above object, there is provided a method for manufacturing a CMOS image sensor according to the present invention, comprising the steps of: a) forming an overcoating layer photoresist on a semiconductor substrate on which a shallow trench isolation and a passivation are formed; b) patterning the overcoating layer photoresist by using an overcoating layer mask; c) forming a blue layer on the patterned overcoating layer photoresist; d) forming a blue pixel by exposing the blue layer by the use of a blue layer exposure light mask; e) forming a red pixel and a green pixel by repetitively performing steps c) and d) to the red and green pixel thereby forming a pattern of a color filter array layer; and f) forming a microlens structure by coating of a microlens layer and then patterning and thermal flowing.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENT

Figure 1:
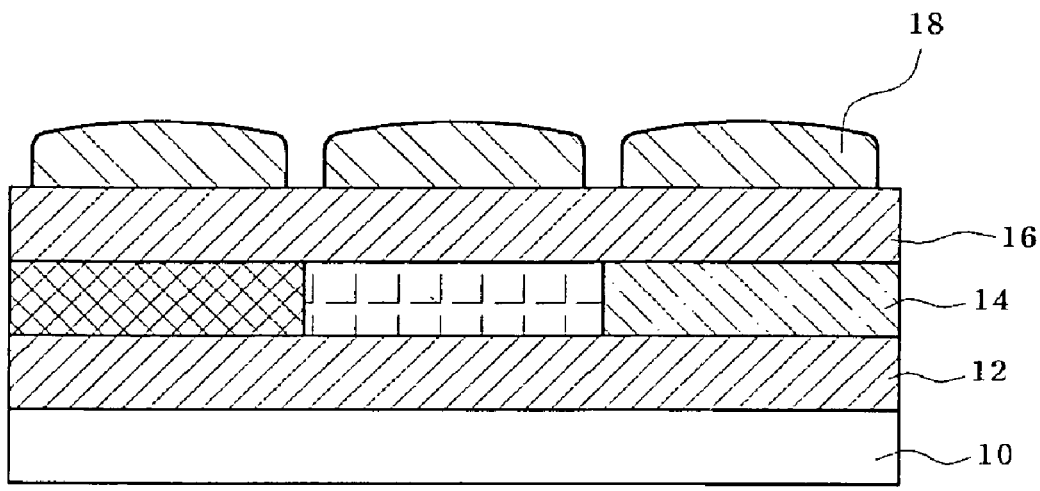
FIG. 1 is a sectional view for showing a CMOS image sensor formed according to one of conventional techniques.

Hereinafter, a preferred embodiment of the present invention will be described in more detail referring to the drawings. In addition, the following embodiment is for illustration only, not intended to limit the scope of the invention.

FIGS. 2a to 2i are sectional views for showing a method for manufacturing a CMOS image sensor according to a preferred embodiment of the present invention.

Figure 2A:
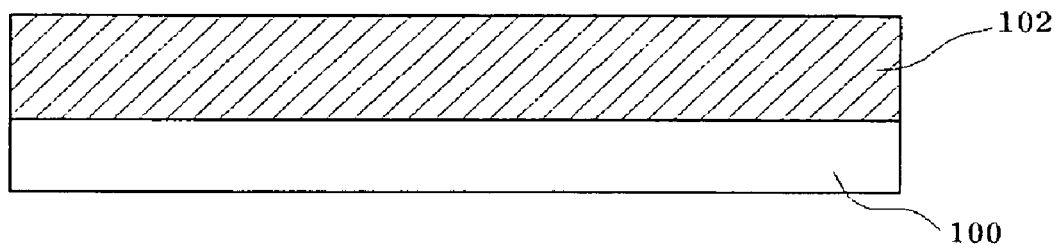
FIGS. 2a to 2i are sectional views showing a method for manufacturing a CMOS image sensor according to a preferred embodiment of the present invention.

Firstly, as shown in FIG. 2a, an overcoating layer photoresist 102 is formed on a semiconductor substrate 100 on which a shallow trench isolation and a passivation are formed.

According to the preferred embodiment of the present invention, a color filter array device composed of blue, red and green pixels representing colors on the device is formed with a 3.2 μm×3.2 μm size. In order to maximize the function of a CFA device by increasing the quantity of external light, a microlens is formed of a photosensitive photoresist of a silicon oxide based having a high transmittance with a 2.5 μm×2.5 μm size.

Additionally, there is a large topology gap of a passivation layer, which is the uppermost layer of the semiconductor substrate 100, in a CFA forming region. Thus, a first overcoating layer, which is a photosensitive overcoating layer photoresist 102 having a high transmittance is formed at a thickness of about 6,000 to 12,000 Å and planarized.

Figure 2B:
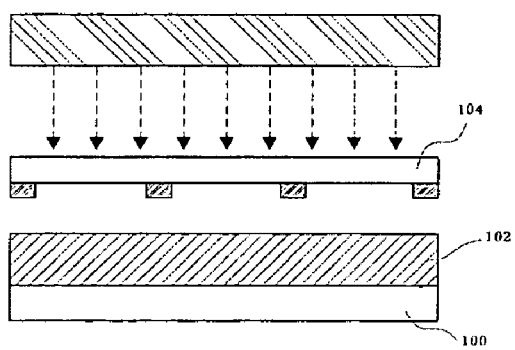

Next, as shown in FIG. 2b, the positive overcoating layer photoresist 102 is patterned by exposure equipment by the use of an overcoating layer mask 104. In this process, only the pixel on which a CFA is to be formed, a pad terminal and some regions are opened by using the overcoating layer photoresist 102 as a positive, and the remaining input/output regions, peri regions, etc. undergoes masking so as to leave the overcoating layer photoresist 102.

According to the preferred embodiment of the present invention, the overcoating layer photoresist 102 is left at about 500 to 1,000 Å as far as the passivation upon the exposure of an overcoating layer to be used as a planarization layer, or completely removed to reduce the distance between the color filter array and the photo-diode existing in the semiconductor substrate 100 so as to reduce the loss of light.

Figure 2C:
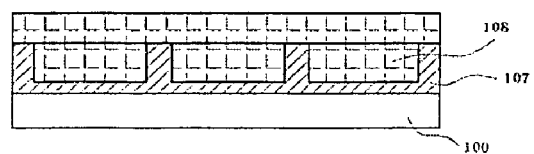

Next, as shown in FIG. 2c, a blue layer 108 patterned by the above mentioned exposure and development process is coated at 9,000 Å. At this time, the overcoating layer photoresist 102 serves as a guide 107 between microlenses (ML) to be formed in the subsequent process and prevents bridging caused by the overflow of the microlenses.

Figure 2D:
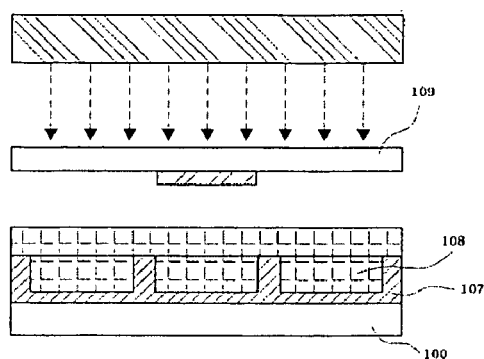

Next, as shown in FIG. 2d, the blue layer 108 is exposed by using a blue layer exposure light mask 109.

Figure 2E:
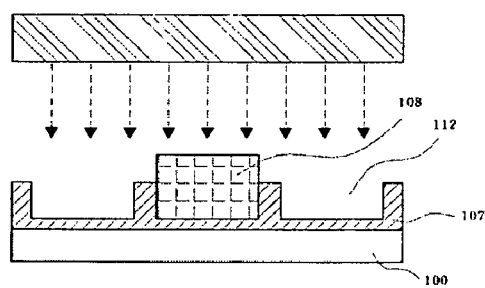
Figure 2F:
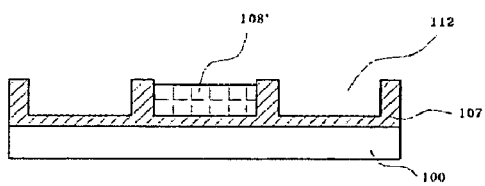

Continually, as shown in FIG. 2e, an over-exposure is carried out in a blank state without a mask in order to stably embody the microlenses to be formed on the color filter array, thereby enabling a blue layer 108' to maintain a thickness of 7,000 to 8,000 Å which is lower than the thickness of the overcoating layer guide 107. This is for the formation of the overcoating layer guide 107 preventing bridging between the microlenses to be formed on the color filter array layer.

Figure 2G:
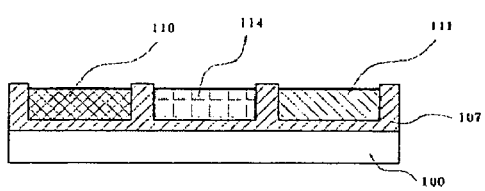

Next, the steps explained with reference to FIGS. 2c to 2f described above are carried out to a red pixel 110 and a green pixel 111 in the same manner, thereby completing the patterning of the color filter array layers 110, 111 and 114 as shown in FIG. 2g.

Figure 2H:
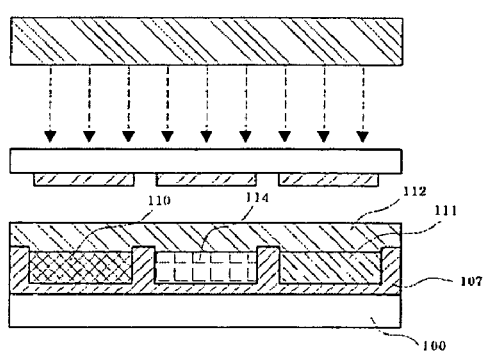
Figure 2I:
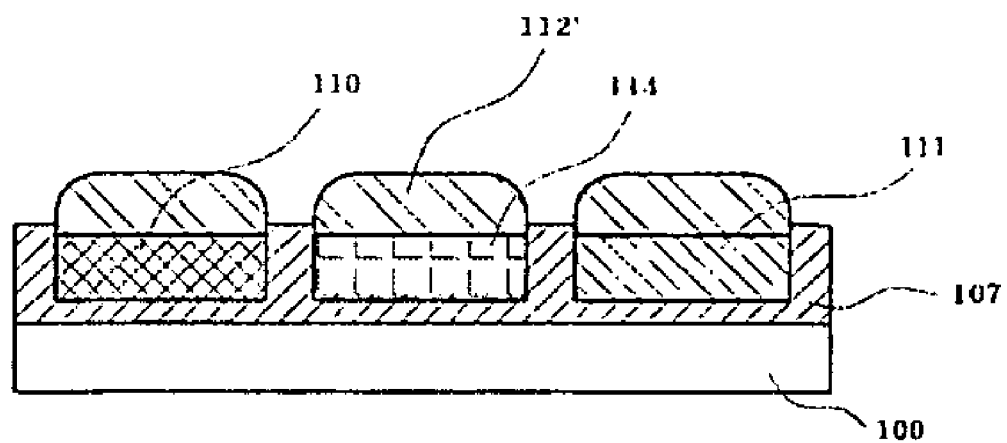

Continually, as shown in FIG. 2h, a microlens 112 is coated at a thickness of about 5500 to 7500 Å, and then patterned and thermally flown to form a microlens 112' as shown in FIG. 2i.

According to the preferred embodiment of the present invention, even if there is no overcoating layer planarization layer (second overcoating layer) that is conventionally used before forming a microlens layer, only a very fine topology exists, thereby making it possible to coat a microlens of 6,000 to 7,000 Å. And, since a negative overcoating resist is employed, it is easy to pattern a color filter array region. Besides, an overcoating layer guide 107 is formed between the color filter arrays 110, 111 and 114, thus there is no bridging occuring between microlenses even in the case of overflowing.

Accordingly, the progress of the microlens process is more stabilize than a conventional one and the height of the color filter array and microlenses are lower by about 12,000 Å than those of conventional ones, thereby minimizing the loss of light through the microlenses and improving the optical integrity in photo-diode regions owing to the microlenses.

As seen from above, the present invention can simplify and stabilize the process and has no drawbacks in comparison with the conventional art in which a double overcoating layer is employed for an etching process and planarization. By this, the properties of a CMOS image sensor device as well as the color filter array properties are improved and process enhancement is accomplished through simplification of the process, thereby saving time and cost.

What is claimed is:

1. A method for manufacturing a CMOS image sensor, comprising the steps of:
    a) forming an overcoating layer on a semiconductor substrate on which a shallow trench isolation and a passivation are formed;
    b) patterning the overcoating layer by using an overcoating layer mask thereby forming an overcoating layer guide;
    c) forming a blue layer on the overcoating layer guide;
    d) patterning the blue layer to have a lower thickness than that of the overcoating layer guide, thereby forming a blue pixel;
    e) forming a red pixel and a green pixel by repetitively performing steps c) and d) to the red and green pixel thereby forming a pattern of a color filter array layer; and
    f) forming a microlens structure by coating a microlens layer over the pattern of the color filter array layer and then patterning and thermal flowing thereof.

2. The method of claim 1, comprising coating the micorlens layer directly on the pattern of the color filter array layer.

3. The method of claim 1, wherein the overcoating layer comprises photoresist.

4. The method of claim 3, comprising forming the overcoating layer at a thickness of 6000 Å to 12000 Å.

5. The method of claim 3, wherein the photoresist is positive.

6. The method of claim 1, comprising subjecting each of the color pixels to a heat treatment process in order to prevent degradation of chromaticity.

7. The method of claim 1, comprising patterning blue, red, and green layers to have a lower thickness than that of the overcoating layer guide by an over-exposure in a blank state.

8. The method of claim 1, comprising coating the microlens layer at a thickness of 5500 Å to 7500 Å by using a silicon oxide film having a high transmittance.

* * * * *